(12) United States Patent
Andres et al.

(10) Patent No.: US 8,728,933 B1
(45) Date of Patent: May 20, 2014

(54) LASER CUTTING AND CHEMICAL EDGE CLEAN FOR THIN-FILM SOLAR CELLS

(75) Inventors: Michael Andres, Santa Clara, CA (US);
Laila Mattos, Palo Alto, CA (US);
Daniel G. Patterson, Morgan Hill, CA (US); Gang He, Cupertino, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/223,133

(22) Filed: Aug. 31, 2011

(51) Int. Cl.
*H01L 21/4763* (2006.01)
(52) U.S. Cl.
USPC ........... 438/637; 438/379; 438/586; 438/668; 438/700; 257/E21.409; 257/E29.255
(58) Field of Classification Search
USPC ........ 438/57–98, 125, 460, 463; 257/99, 234, 257/433, E21.001, E21.228, E21.599, 257/E33.062; 136/244, 255, 256, 258, 558
See application file for complete search history.

(56) References Cited

U.S. PATENT DOCUMENTS

| | | | | |
|---|---|---|---|---|
| 4,667,058 | A | * | 5/1987 | Catalano et al. ............... 136/244 |
| 5,817,569 | A | * | 10/1998 | Brenner et al. ............... 438/460 |
| 6,849,524 | B2 | | 2/2005 | Shelton et al. |
| 7,772,090 | B2 | | 8/2010 | Starkston et al. |
| 7,804,043 | B2 | | 9/2010 | Deshi |
| 2002/0086137 | A1 | | 7/2002 | Brouillette et al. |
| 2003/0180983 | A1 | * | 9/2003 | Oswald et al. .................. 438/57 |
| 2007/0272666 | A1 | | 11/2007 | O'Brien et al. |
| 2007/0272668 | A1 | | 11/2007 | Albelo et al. |
| 2008/0070378 | A1 | | 3/2008 | Yeo |
| 2008/0220590 | A1 | | 9/2008 | Miller et al. |
| 2010/0099238 | A1 | | 4/2010 | Vakanas et al. |
| 2010/0219509 | A1 | | 9/2010 | He et al. |
| 2010/0279490 | A1 | | 11/2010 | Starkston et al. |
| 2011/0298156 | A1 | * | 12/2011 | Hooper et al. ................ 264/400 |

\* cited by examiner

*Primary Examiner* — Charles Garber
*Assistant Examiner* — Abdulfattah Mustapha
(74) *Attorney, Agent, or Firm* — Thomas Schneck; Gina McCarthy

(57) ABSTRACT

A method of kerf formation and treatment for solar cells and semiconductor films and a system therefor are described. A semiconductor film is backed by a first metal layer and topped by a second metal layer. A reference feature is defined on the film. An ultraviolet laser beam is aligned to the reference feature. A kerf is cut along the reference feature, using the ultraviolet laser beam. The beam cuts through the second metal layer, through the film and through the first metal layer. Cutting leaves debris deposited on walls of the kerf. The debris is cleaned off of the walls, using an acid-based solvent. In the case of solar cells, respective first terminals of the solar cells are electrically isolated by the cleaned kerf, and respective negative terminals of the solar cells are electrically isolated by the cleaned kerf.

14 Claims, 5 Drawing Sheets

LASER CUTTING AND CHEMICAL EDGE CLEAN FOR THIN-FILM SOLAR CELLS

TECHNICAL FIELD

The field of the present invention relates to semiconductor substrate dicing by laser radiation.

BACKGROUND

Traditional methods or systems for scribing, cutting and separating semiconductor devices from a semiconductor wafer, i.e. dicing, rely on cutting a street defined by a scribe line, using a diamond saw or a laser. Cutting produces a kerf with side walls or edges, the kerf width being the distance or spacing between opposing side walls or edges. In through-cutting, a single pass is made using the diamond saw or laser, cutting all the way through the wafer. In another technique, known as wafer fracturing, die separation is performed by cutting along a street partially through the thickness of the wafer, then cracking the wafer along the street and separating the dice. A scribe line can be expressed or delineated physically on the wafer, using scribe line geometries that are photolithographically deposited using one or more layers on the wafer, such as by using photoresist and etching. A scribe line can be physically delineated on, the wafer by laser ablation of the wafer surface. Alternatively, a scribe line can be defined on the wafer in the abstract, for example using data in a computer memory, as a path along which a street is to be cut where only a reference feature on the wafer is needed. Whether or not a scribe line is physically delineated on a wafer, the scribe line can be expressed as a set of coordinates relative to the wafer.

Mechanical cutting of semiconductor wafers can cause cracks, splitting, damage to PN junctions and other effects on the wafers and devices being fabricated on the wafers. The width of the street and the corresponding amount of material removed represents wasted area of the wafer. It is desired to minimize the width of the street and minimize the wasted area of the wafer, thereby minimizing the cost per die produced.

Laser cutting generally produces a narrower street than diamond saw cutting. However, local heating from laser cutting can damage PN junctions. Combining a semiconductor wafer with one or more additional materials poses additional challenges to laser cutting or mechanical cutting.

Standard silicon wafers are nominally 275 microns to 775 microns thick, although additional sizes have been and are being developed. Thin wafers are nominally 100 microns to 150 microns thick. Ultrathin wafers can support thin films of nanometer or monolayer thicknesses and be up to several microns thick. Thin wafers or ultrathin wafers may need additional support during fabrication and handling, which poses challenges to laser cutting or mechanical cutting.

Solar cells, also known as photovoltaic cells, can be made from silicon wafers or gallium arsenide wafers, or from thin films such as gallium arsenide films, among other materials. Epitaxial lift-off (ELO) films can be grown on wafers, then transferred to support surfaces. U.S. published application 2010/0219509 entitled "Tiled Substrates for Deposition and Epitaxial Lift Off Processes" by G. He and A. Hegedus, assigned to the assignee of the present invention and incorporated by reference herein, shows epitaxially grown film stacks transferred to a support substrate in a tiling pattern with gaps or streets between each of the ELO film stacks. An extensive list of support substrate materials is contained in the aforementioned published application.

Typically, solar cells are cut from semiconductor wafers and mounted in a solar panel. Solar cells generally have one PN junction fabricated vertically in the wafer, often with the N type material towards the front major surface of the wafer and the P type material towards the back major surface of the wafer. Metal traces on the front surface of the wafer are connected as one or more buss bars to one terminal of the solar cell, and metal backing the entirety of the back surface of the wafer is connected to another terminal of the solar cell. The presence of the large PN junction throughout the solar cell poses challenges to laser cutting or mechanical cutting, as shorting of the PN junction at any location on a scribe line can ruin the entire solar cell.

Slag or ablation debris is produced during laser cutting, and deposited along edges of the cut and nearby surfaces. This debris can short-circuit electrical junctions of solar cells or integrated circuits, or provide resistive paths degrading device performance. On solar cells, the debris can block photons, decreasing solar cell efficiency. Since the debris is made of the same material as the wafer albeit lacking the crystalline structure of the wafer, the debris can bond to wafer surfaces and be difficult to remove.

SUMMARY

A method of kerf formation and treatment for solar cells and semiconductor films, a system for kerf cleaning of solar cells in preparation for testing, and embodiments thereof are described.

In a method of kerf formation and treatment for solar cells, a semiconductor film is provided. The film has a plurality of solar cells thereupon. The film is backed by a first metal layer connecting respective first terminals of the solar cells. The film has a front surface, topped by a second metal layer. The second metal layer connects respective second terminals of the solar cells. A reference feature is defined on the wafer between a first solar cell and a second solar cell. An ultraviolet laser beam is aligned to the reference feature. Cutting is performed along the reference feature, using the aligned ultraviolet laser beam. The ultraviolet laser beam cuts from the front surface of the second metal layer through the second metal layer, through the film, through the first metal layer and to or partially into a support material backing the first metal layer. The cutting leaves a kerf having walls with debris deposited on the walls. Using an acid-based solvent, the debris is cleaned off of the walls of the kerf. The respective first terminals of the first and second solar cells are electrically isolated by the cleaned kerf. The respective second terminals of the first and second solar cells are electrically isolated by the cleaned kerf.

In a method of kerf formation and treatment in semiconductor films, a semiconductor film is provided. The semiconductor film has semiconductor devices thereupon, and has a front surface. A metal seed layer is deposited on top of the front surface of the film. A reference feature is defined on the film. A photoresist layer is deposited on top of the metal seed layer. The photoresist layer defines a non-plated region that includes the reference feature. A metal plating is deposited on top of the metal seed layer. The metal plating is deposited in a plating region having an absence of the photoresist layer. An ultraviolet laser beam is directed to cut through the photoresist layer, through the metal seed layer and through the semiconductor film. The film and the ultraviolet laser beam are moved relative to each other, to laser cut along the reference feature. The laser cutting forms a kerf with edges and deposits debris on a portion of the photoresist layer and on the kerf edges. The kerfs are wet-cleaned to remove the debris. The wet-cleaning uses an acid-based solvent. The photoresist layer is stripped. Stripping the photoresist layer exposes a portion of the metal seed layer in the non-plated region. The exposed portion of the metal seed layer is etched, using an etchant that preferentially removes material of the metal seed layer. The metal plating remains in the plating region. A to-be-exposed portion of the front surface of the semiconductor film in the non-plated region becomes exposed. The photoresist layer and the portion of the metal seed layer in the non-plated region protect the to-be-exposed portion of the front surface of the semiconductor film from debris during the laser cutting.

A system for kerf cleansing of solar cells in preparation for testing comprises a semiconductor film, an ultraviolet laser beam and an edge clean station. The semiconductor film has solar cells and is backed by a metal layer that is adhered by an adhesive layer to a flexible substrate. A reference feature is defined between a first and a second solar cell. The ultraviolet laser beam is configured to cut through the film and through the metal layer, using the reference feature. The cutting produces a kerf with side walls and deposits slag along the side walls. A portion of the adhesive layer or the flexible substrate forms a floor of the kerf. The edge clean station is configured to remove the slag from the edges of the kerf. At least one wet chemical is used in the edge clean station. Cleaning at the edge clean station produces a cleaned kerf. Respective first electrical terminals of the first and second solar cells are electrically isolated from each other by the cleaned kerf. Respective second electrical terminals of the first and second solar cells are electrically isolated from each other by the cleaned kerf.

DETAILED DESCRIPTION

Figure 1:
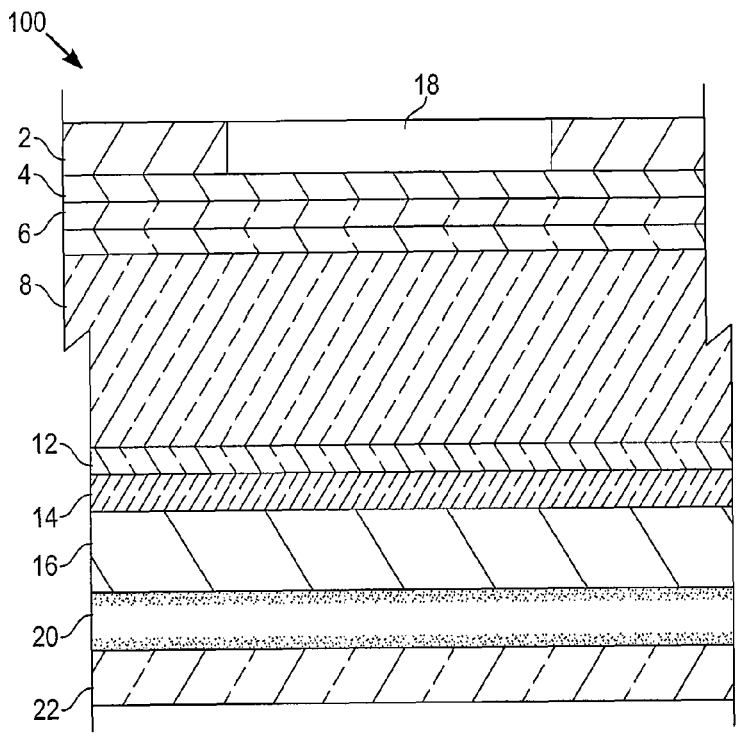
FIG. 1 is a cross-sectional view of a semiconductor film backed by a first metal layer, as prepared for a laser cut and edge clean in accordance with the present invention. Solar cells are fabricated on the film.
Figure 2:
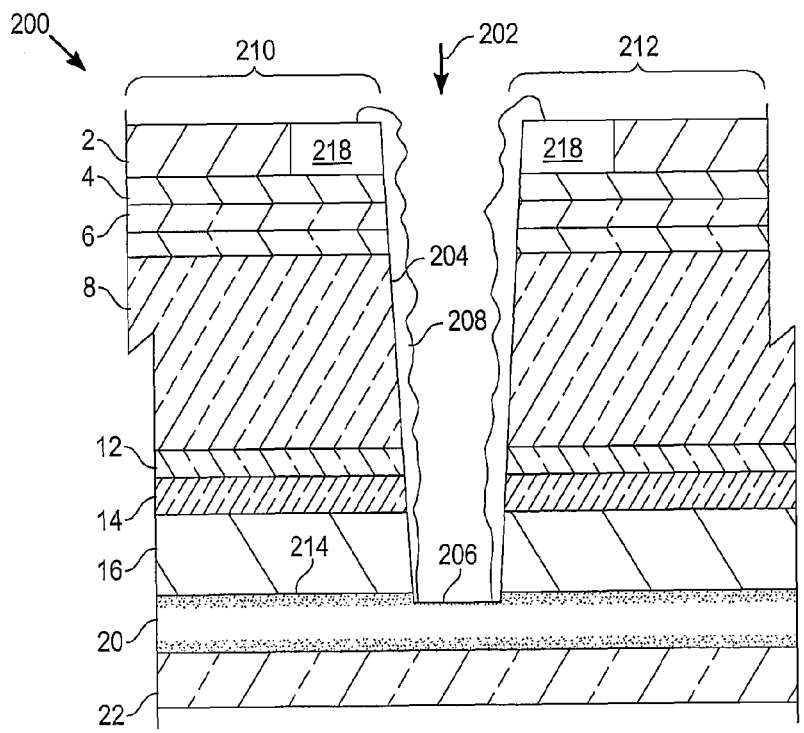
FIG. 2 is a cross-sectional view of the film of FIG. 1 with a laser cut through the film and the first metal layer. Slag or ablation debris is present.
Figure 3:
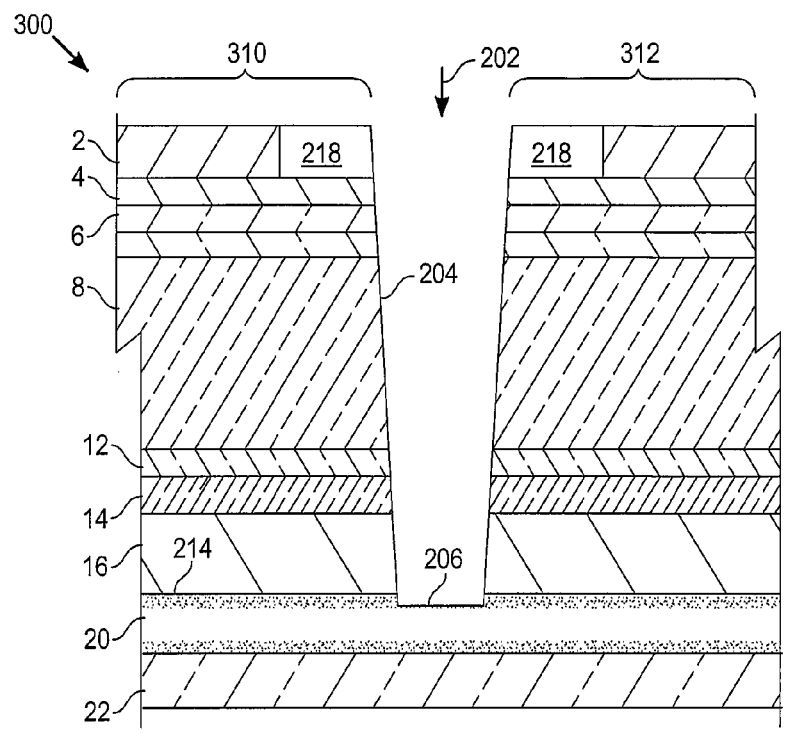
FIG. 3 is a cross-sectional view of the film of FIG. 2, with the slag or ablation debris removed by an edge clean.
Figure 4:
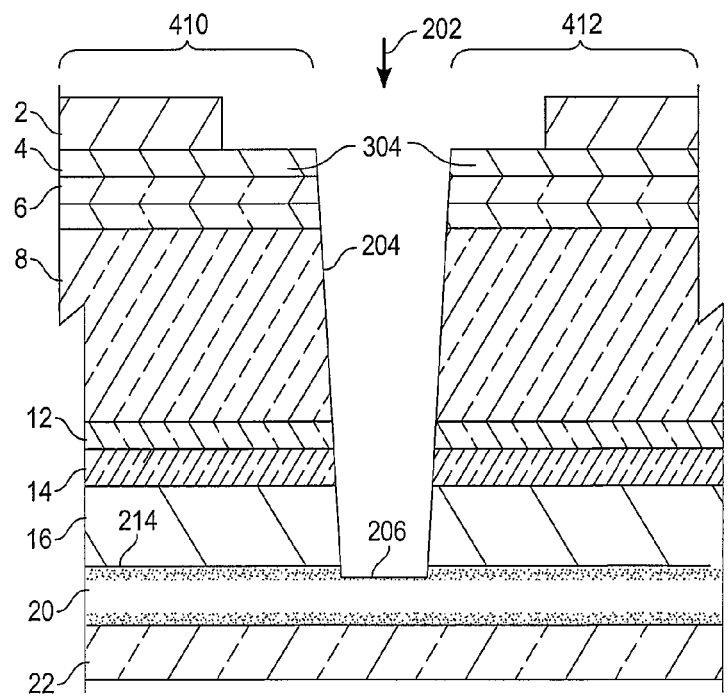
FIG. 4 is a cross-sectional view of the film of FIG. 3, with photoresist removed.
Figure 5:
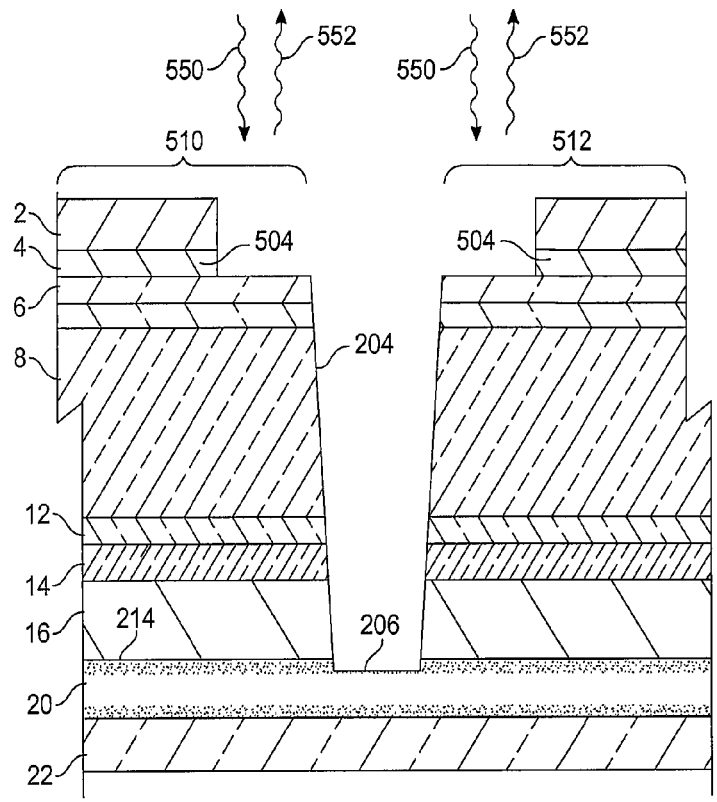
FIG. 5 is a cross-sectional view of the film of FIG. 4, with an exposed portion of a second metal layer removed.
Figure 6:
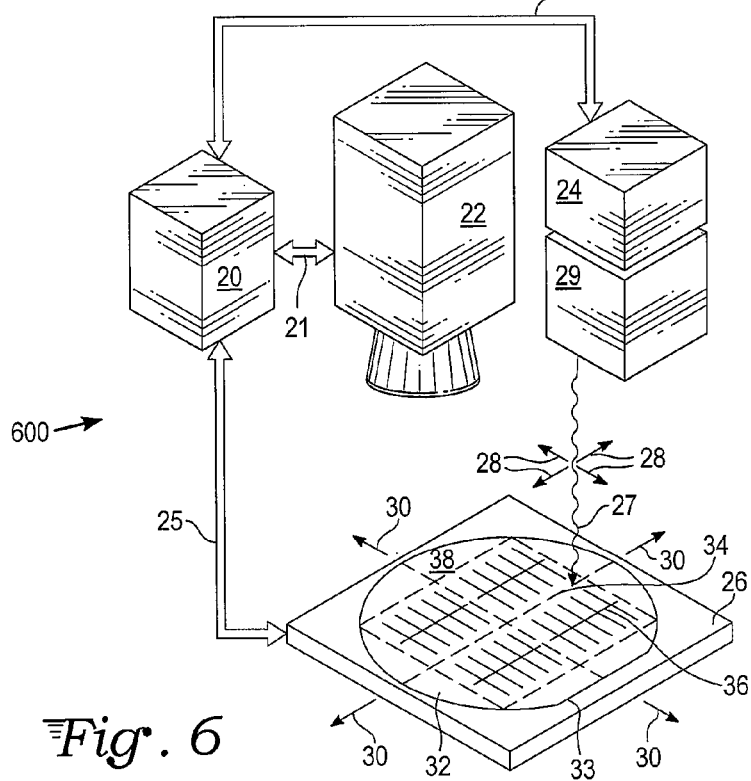
FIG. 6 is a perspective view of a laser cutting system acting on the film of FIG. 1, cutting a frontside street or kerf along a scribe line of the film.
Figure 7A:
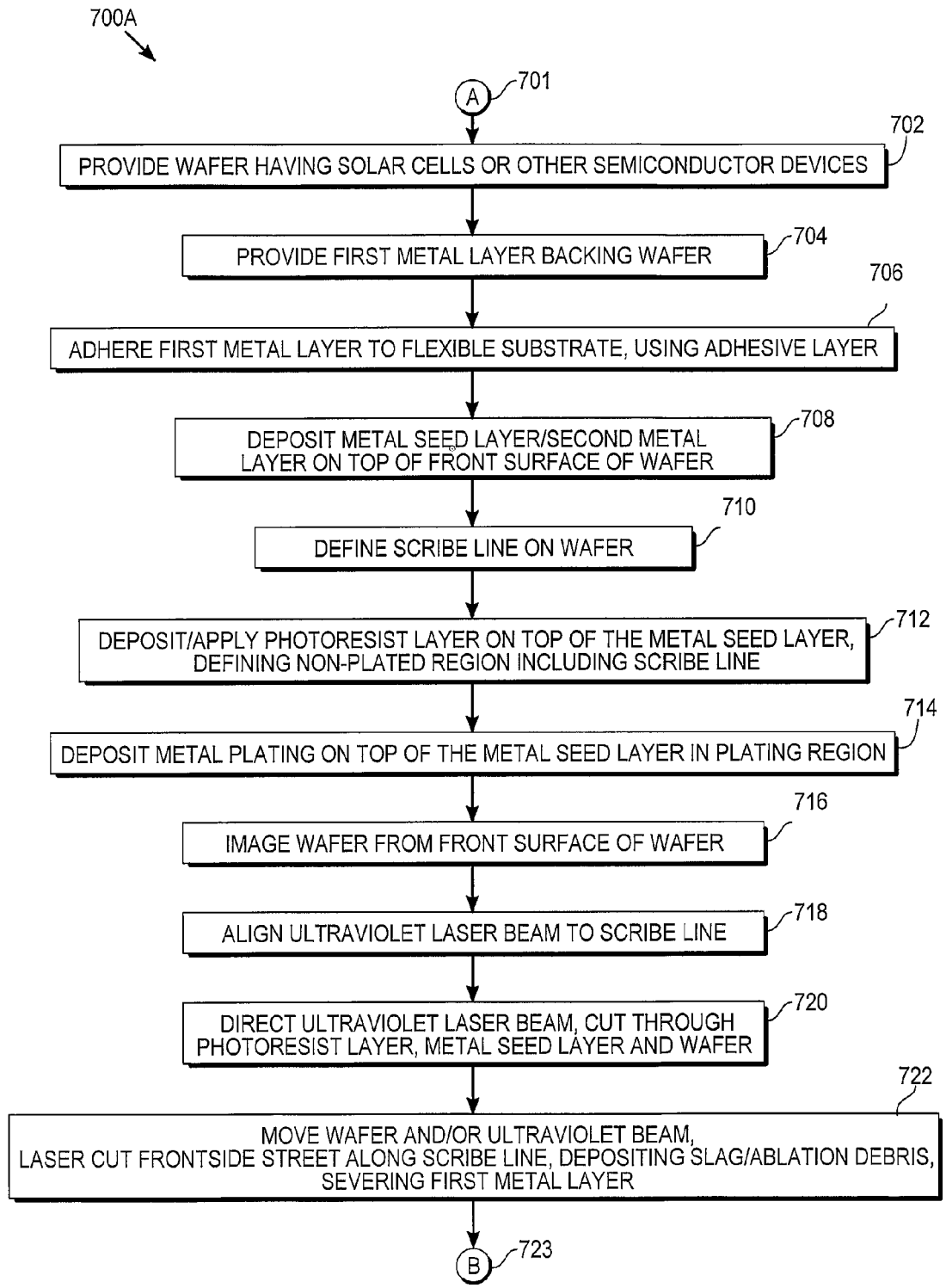
FIGS. 7A and 7B are a flow diagram of a method of performing a laser cut and edge clean as shown on the semiconductor film in FIGS. 1-5. The method is usable with the laser cutting system of FIG. 6.
Figure 7B:
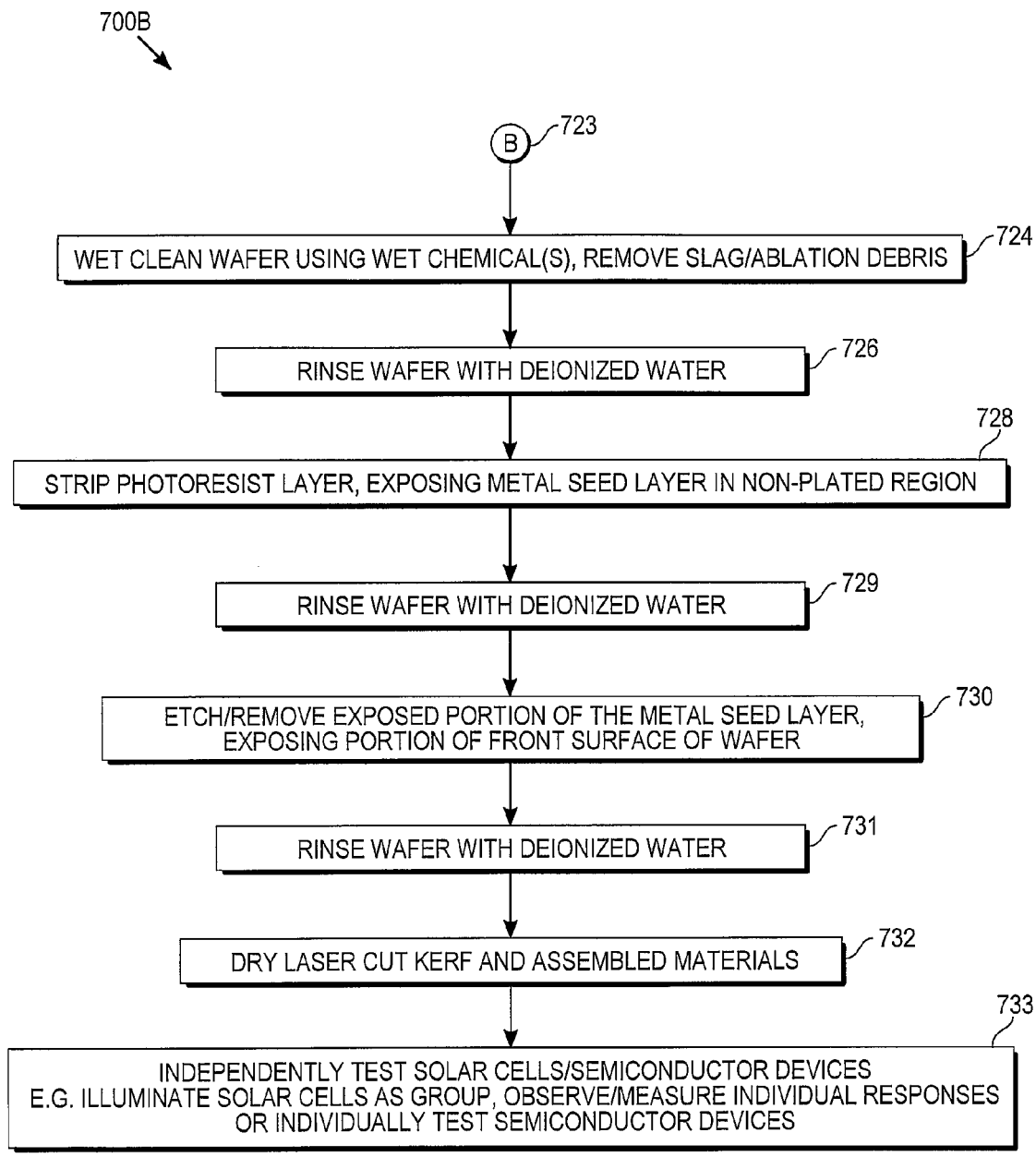

With reference to FIGS. 1-3, cross-section views of a laser cutting and chemical edge clean are shown as practiced upon the semiconductor film of FIG. 1 having solar cells thereupon. In the example shown, the semiconductor film is an epitaxial liftoff film. Although an epitaxial liftoff film is shown, the method can be practiced on other types of semiconductor films. In an embodiment, the method is practiced on a semiconductor wafer. In a further embodiment, the method is practiced on a semiconductor film that is formed on a semiconductor wafer. Cross-section views of the film undergoing further processing steps are shown in FIGS. 4 and 5. A laser cutting system acting on the film of FIG. 1 is shown in FIG. 6, and a flow diagram is shown in FIGS. 7A and 7B. Embodiments of the method and system are usable on various semiconductor films and wafers having various semiconductor devices. The laser cutting and chemical edge clean processes provide decreased semiconductor waste as compared to known wafer and film sawing using a diamond saw and may provide improved solar cell or other semiconductor device yield as compared to known laser cutting techniques.

With reference to FIG. 1, a gallium arsenide film 100 is prepared for cutting by laser, so that semiconductor devices on the film can be separated and tested. In this example, the semiconductor devices are solar cells. In further examples, the semiconductor devices are integrated circuits. In still further examples, the semiconductor devices are micro-machined devices. As used herein, the term "film" is used inclusively to mean a semiconductor film in various stages of processing and includes various materials added to or removed from the film e.g. metals, photoresist, deposited or etched layers, etc. and is not limited to the original film semiconductor material exclusively.

From a front surface of the film 100, the layers of materials are as follows. A plating metal layer 2 is on top of a seed metal layer 4, which is on top of a plurality of doped and undoped gallium arsenide layers 6, 8, 12, 14 defining the vertical PN junction for a plurality of laterally disposed solar cells. The N type material (also known as n-type material) is towards the front surface of the solar cell in the upper gallium arsenide layers 4, 6, 8 and the P type material (also known as p-type material) is towards the back surface of the solar cell in the lower gallium arsenide layers 12, 14. A first metal layer 16 is a backing metal layer, and backs the film. In this example, the backing metal layer or first metal layer 16 connects to the single positive terminal of the undifferentiated solar cells on the film, i.e. connects across what will become the respective positive terminals of the solar cells once the solar cells become differentiated by dicing the film. The first metal layer 16 is attached to an adhesive layer 20, which is then attached to a flexible polymer substrate 22. In this example, the flexible polymer substrate 22 is made of polyethylene terephthalate (PET). The adhesive layer 20 and the flexible substrate 22 form a flexible support material.

Various processing sequences can achieve the stack of the materials as shown in FIG. 1. In one example, the gallium arsenide layers 6, 8, 12, 14 are produced by known or proprietary semiconductor processing techniques, and the first metal layer 16 is deposited on the backside of the film 100. A second metal layer, the seed metal layer 4, is deposited on the front side of the film 100. The seed metal layer 4 provides a favorable surface for metal plating, which in turn provides a thicker metal layer better suited for the large amount of current carried by the buss bars of a solar cell. The first metal layer 16 is laminated to the polymer substrate 22 by using the adhesive layer 20 to attach the polymer substrate 22 to the metal layer 16.

In order to define the buss bars of the solar cell, a layer of photoresist 18 is deposited on top of the seed metal layer 4. The layer of photoresist 18 is deposited in a non-plated region, and the adjacent area or region of the seed metal layer 4 having an absence of the photoresist 18 becomes a plating region.

The photoresist layer 18 is deposited or applied by known, conventional means. In one example, a measured amount of photoresist is placed on the film, and the film is spun on a substrate spinning machine. The film is exposed to a pattern defining the buss bars of the solar cells, using photolithography. The exposed or unexposed portion of the photoresist is removed, depending on whether positive or negative photoresist and corresponding positive or negative masking is used to define the pattern, with the region having photoresist remaining defining the non-plated region and the region having an absence of photoresist defining the plating region.

The front surface of the film is then subjected to a plating process, and the plating metal sticks to the seed metal layer 4 in the plating region, forming the plating metal layer 2. The plating metal does not stick to the photoresist layer 18, and thus the lion-plated region does not accumulate plating metal. The geometries of the plating metal layer 2 define the metal interconnect of the buss bars of the negative terminals of the solar cell, as can be seen in FIG. 6.

A scribe line (not shown in FIG. 1, and see FIGS. 2 and 6) is defined on the film 100 prior to making the laser cut. The scribe line is defined between neighboring solar cells or other semiconductor devices, and the laser cut is along the scribe line. In order to avoid severing a buss bar of a solar cell, the scribe line is defined in a non-plated region. In the example shown in FIG. 1, the scribe line is defined in the non-plated region occupied by the photoresist layer 18. Thus, one or more of the non-plated regions on the film, having the photoresist layer 18, includes the scribe line.

With reference to FIG. 2, an ultraviolet laser beam (not shown in FIG. 2, and see FIG. 6) is aligned with the scribe line and is pointed in an aligned laser cutting direction 202 towards the front surface of the film 100. The ultraviolet laser beam makes a laser cut by ablation through the film and through the first metal layer 16 to produce the laser cut film 200, and cuts along the scribe line to form a frontside street as will be discussed with reference to FIG. 6. The ultraviolet laser beam cuts through the photoresist layer 18, separating the photoresist layer 18 into respective portions 218 of the photoresist layer 18, cuts through the seed metal layer 4, cuts through the gallium arsenide layers 6, 8, 12 and 14, cuts through the first metal layer 16 and stops cutting at or partially into the adhesive layer 20. The cross sectional view in FIG. 2 is a close-up view and shows respective portions of the first solar cell 210 and the second solar cell 212, each of which extends laterally past the boundaries of the diagram.

In FIG. 2, slag or ablation debris 208 can be seen on the walls 204 and adjacent surfaces of the portions 218 of the photoresist layer 18, as well as on portions of the floor 206 of the frontside street or kerf being formed by the laser cut 200. If the slag or ablation debris 208 is not removed, the PN junction of one or both of the first and second solar cells 210, 212 can be shorted.

With reference to FIG. 3, the slag or ablation debris 208 is removed by an edge clean process. The edge clean process includes a wet-clean of the laser cut film 200 to produce the cleaned film 300 having a cleaned frontside street or kerf. At least one wet chemical is used in the wet-clean. In one example, the wet chemical is an acid-based solvent and includes a mixture of hydrogen peroxide, sulfuric acid and water. In a further example, the wet chemical is an acid-based solvent and includes a mixture of hydrogen peroxide, sulfuric acid, phosphoric acid and water. The wet-clean is followed by a deionized water rinse, which removes leftover chemicals and loose debris.

With reference to FIG. 4, the portions 218 of photoresist layer 18 are removed, exposing portions 304 of the seed metal layer 4. The stripping of the photoresist layer is followed in one example by a rinsing with deionized water.

With reference to FIG. 5, the exposed portions 304 of the seed metal layer 4 are removed, using an etchant that preferentially etches the type of material used in the seed metal layer 4 as compared to the type of material used in the plating metal layer 2. In various examples, a wet etch or a plasma etch can be used. The etching is followed in one example by a rinse with deionized water. The deionized water rinse is followed by drying the materials.

Having removed the exposed portions 304 of the seed metal layer 4, the remaining portions 504 of the seed metal 4 and respective portions of the plating metal layer 2 form the respective negative terminals of the first solar cell 510 and second solar cell 512 (which are in turn the further processed solar cells 310, 410 and 312, 412, respectively). The laser cutting of FIG. 2 and cleaning of FIG. 3 result in the electrical isolation of the respective negative terminals of the neighboring solar cells e.g. the first solar cell 510 and the second solar cell 512. The severing of the first metal layer 16 separates the respective positive terminals of the neighboring solar cells.

Recall that the seed metal layer 4 formed a connection across the undifferentiated negative terminals of the undifferentiated neighboring solar cells, prior to making the laser cut along the scribe line. Thus, with the seed metal layer 4 intact across the film as shown in FIG. 1, independent testing of the solar cells is disabled by the second metal layer connecting the respective negative terminals of the neighboring solar cells. The cleaned frontside street or kerf, as shown in FIGS. 3-5 electrically isolates the respective negative terminals of the neighboring solar cells, thereby enabling independent testing of the solar cells. The solar cells, or integrated circuits or other semiconductor devices in further examples, are dried prior to testing.

The neighboring solar cells can be tested independently and individually, with illumination applied to the solar cells as a group. In FIG. 5, incident photons 550 from an illumination source aimed at the film are absorbed into the first solar cell 510 and the second solar cell 512. In a photoluminescence test, each of the solar cells re-radiates a respective photon 552, which phenomenon can be observed macroscopically in a known photoluminescence test.

In further examples of testing, the respective negative terminals of the first and second solar cell 510 and 512 (e.g. as connected to the respective buss bars of the solar cells at the respective portions of the plating metal layer 2) can be connected to current, and voltage measurement instrumentation for various tests. The respective positive terminal of each of the neighboring solar cells can be connected to the current and voltage measurement instrumentation for testing of the solar cells. Open circuit voltage (Voc), short-circuit current (Isc), current and voltage curves (IV characteristics) and maximum power point (Pmax) determination are among the tests that can be performed independently on respective individual solar cells as a result of the negative terminals of the respective solar cells being electrically isolated. Such tests can be performed with group illumination of the solar cells.

With reference to FIG. 6, a laser cutting system 600 is shown performing the laser cut to produce the laser cut film 200 as seen in FIG. 2. A controller 20 has a bidirectional communication path 21 to an imaging camera 22, and a bidirectional communication path 23 to an ultraviolet laser 24 and beam steering device 29. An ultraviolet laser beam 27, produced by the ultraviolet laser 24 and steered by the beam steering device 29, cuts along a scribe line 34 defined on the film 32. The cut is performed from the front surface 38 of the film 32. The ultraviolet laser beam 27 and the film 32 are moved relative to each other, by moving the ultraviolet laser beam 27 in various directions 28 and/or by moving the film 32 in various directions 30. In one embodiment, the ultraviolet laser beam 27 is moved by beam steering optics, i.e. the beam steering device 29 includes beam steering optics, and the stage 26 is stationary. Examples of beam steering optics suitable for use in the beam steering device 29 include rotating mirrors, steerable mirrors, steerable lenses and combinations thereof. In a further embodiment, the beam steering device 29 includes a set of actuators that move the ultraviolet laser 24, thereby moving the ultraviolet laser beam 27. In a still further embodiment, the film 32 is moved by a movable stage 26 controlled by the controller 20 over a bidirectional communication path 25, and the ultraviolet laser beam 27 is stationary. In further embodiments, both the stage 26 and the ultraviolet laser beam 27 are movable. In embodiments, one or more of the communication paths is unidirectional.

Various techniques can be used to align the ultraviolet laser beam 27 to the film 32 for cutting a frontside street along the scribe line 34 from a front surface 38 of the film 32. Alignment can be performed before a laser beam is switched on, such as by positioning a laser, positioning a film, positioning a movable stage holding the film, or preparing data that will direct a laser beam or a movable stage.

In a first frontside alignment technique, the imaging camera 22 captures or forms an image of the exposed front surface 38 of the film 32, including metal traces 36 on the front surface 38 of the film 32. The metal traces 36 are, in this example, the buss bars of the negative terminal of the solar cell, and are in electrical contact with the N type material of the large PN diode junction that forms the solar cell. In further examples, the metal traces can be top layer metal interconnect on an integrated circuit or other previously deposited metal pattern on the front surface of the solar cell, die or film. In further examples, geometries other than metal traces could be used for image capturing.

A scribe line 34 is defined on the film. The scribe line can be shown or highlighted, i.e. physically represented, by photolithographically deposited or laser ablated scribe line geometries using known processes. In an embodiment, the scribe line is defined in the abstract e.g. as a set of coordinates relative to the film as determined using machine vision.

Using machine vision, the controller 20 cooperates with the imaging camera 22 and produces a first data set in computer memory representing the image of the front surface 38 of the film 32. Various machine vision operations may be performed, such as imaging under various lighting conditions, x-ray, infrared or other types of imaging, 2-D or 3-D imaging, image processing, signal processing, grayscale or color intensity manipulation, edge enhancement, edge extraction, feature extraction, pattern matching, pattern recognition, orientation determination, linking, mapping, generation or determination of data sets, reference points, coordinates and so on. At least a first reference point or reference feature relative to the image of the front surface 38 of the film 32 is determined, such as a starting point or an ending point for cutting the frontside street along the scribe line 34, an intersection of two scribe lines or frontside streets, a location along one of the metal traces 36, or a location along a flat 33 of the film 32.

In preparation for cutting the frontside street, the controller 20 links the scribe line 34 to the first reference point and may link to further reference points. The controller 20 prepares data for guiding the ultraviolet laser beam 27 from the ultraviolet laser 24, based upon the linking of the scribe line 34 to the first reference point. In this manner, the ultraviolet laser beam 27 is aligned to the film 32 from the front surface 38 of the film 32 and is aligned to the scribe line 34 from the front surface 38 of the film 32.

In embodiments of the first frontside alignment technique, the ultraviolet laser beam 27 is aligned to the scribe line 34 from the front surface 38 of the film 32 by recognizing the metal traces 36, the wafer flat 33 (e.g. as when the film 32 is an epitaxial liftoff film from a wafer having a wafer flat), photolithographically deposited scribe line geometries or alignment targets (not shown but readily understood by a person skilled in the art), or other reference feature or features imaged and processed by machine vision.

In further embodiments of alignment techniques, machine vision is not used, and alignment is done by manual positioning, optically assisted positioning and/or dead reckoning from coordinates obtained when the film was at another location or from coordinates based upon an average film or a test fixture. Such embodiments of the system may trade off cost, speed and accuracy, by omitting the imaging camera 22.

With reference to FIGS. 7A and 7B, a method 700 of performing a laser cut and chemical edge clean on a semiconductor wafer or a semiconductor film is shown, as can be practiced using the film shown in FIGS. 1-5 and using the laser cutting system 600 shown in FIG. 6. Embodiments of the method use some of the steps, combine some of the steps or change the sequences of some of the steps. The method 700 is presented in two sections, with method 700A including aspects of providing the assembled materials and laser cutting to form a kerf, and method 700B including aspects of cleaning, rinsing, drying and testing.

The method 700 starts with method 700A in FIG. 7A at entry point "A" 701 and has blocks as shown. In a block 702, a wafer is provided. The wafer has solar cells or other semiconductor devices. In a block 704, a first metal layer is provided. The metal layer backs the wafer. In a block 706, the first metal layer is adhered to a flexible substrate, using an adhesive layer. The adhesive layer is between the first metal layer and the flexible substrate. In one example, the flexible substrate is PTE. In a block 708, a metal seed layer or second metal layer is deposited on top of the front surface of the wafer. In a block 710, a scribe line is defined on the wafer. In a block 712, a photoresist layer is deposited or applied on top of the metal seed layer. The photoresist layer defines a non-plated region. The scribe line is included in the non-plated region. In a block 714, metal plating is deposited on top of the metal seed layer. The metal plating is deposited in a plating region. In a block 716, the wafer is imaged from the front surface of the wafer. In a block 718, an ultraviolet laser beam is aligned to the scribe line. In a block 720, the ultraviolet laser beam is directed to cut through the photoresist layer, the metal seed layer and the wafer. In a block 722, the wafer and the ultraviolet beam are moved relative to each other, i.e. the wafer or the ultraviolet beam is moved or both are moved. The laser cuts a frontside street along the scribe line, depositing slag or ablation debris and severing the first metal layer. The cutting forms a kerf having side walls, with slag or ablation debris deposited upon the walls. The method 700A goes to entry point "B" 723 in order to continue method 700 with method 700B.

The method 700 continues with method 700B in FIG. 7B starting at entry point "B" 723 and has blocks as shown. In a block 724, the wafer is wet cleaned, using one or more wet chemical. The wet cleaning removes the slag or ablation debris. In a block 726, the wafer is rinsed with deionized water. In a block 728, the photoresist layer is stripped. Stripping the photoresist layer exposes the metal seed layer in the non-plated region. In a block 729, the wafer is rinsed with deionized water. In a block 730, the exposed portion of the metal seed layer is etched or removed. Removing the exposed portion of the metal seed layer exposes a portion of the front surface of the wafer. During the laser cutting, the photoresist layer and the portion of the metal seed layer protect the portion of the front surface of the wafer that becomes exposed when the exposed portion of the metal seed layer is removed. In a block 731, the laser cut kerf and assembled materials are rinsed, i.e. the wafer is rinsed, with deionized water. In a block 732, the laser cut kerf and assembled materials are dried. The drying action can be performed by blowing nitrogen, air or other gas at ambient or elevated temperature towards the wafer and/or by heating the wafer. In a block 733, the solar cells or semiconductor devices are independently tested. In one example, the solar cells are illuminated as a group, and individual responses of the solar cells are observed or measured. In a further example, semiconductor devices are individually tested. Severing the first metal layer along the scribe line separates the solar cells or semiconductor devices, which can then be tested individually and independently.

What is claimed is:

1. A method of kerf formation and treatment for solar cells, comprising:
    providing a semiconductor film that has a plurality of solar cells thereupon and is backed by a first metal layer connecting respective first terminals of the solar cells, the film having a front surface topped by a second metal layer connecting respective second terminals of the solar cells;
    defining a reference feature on the film between a first solar cell and a second solar cell;
    aligning an ultraviolet laser beam to the reference feature;
    cutting along the reference feature, using the aligned ultraviolet laser beam to cut from the front surface of the second metal layer, through the second metal layer, through the film, through the first metal layer and to or partially into a support material backing the first metal layer, leaving a kerf having walls with debris deposited upon the walls; and
    cleaning the debris off of the walls of the kerf, using an acid-based solvent, wherein the respective first terminals of the first and second solar cells are electrically isolated by the cleaned kerf and the respective second terminals of the first and second solar cells are electrically isolated by the cleaned kerf.

2. The method of claim 1 further comprising:
    drying the solar cells; and
    testing the first and second solar cells independently after cleaning the debris off the walls of the kerf, wherein independent testing of the solar cells is disabled by the second metal layer connecting the respective second terminals of the first and second solar cells prior to cutting the kerf and is enabled by the cleaned kerf electrically isolating the respective second terminals of the first and second solar cells.

3. The method of claim 1 further comprising severing the support material along the scribe line, thereby physically separating the first and second solar cells.

4. The method of claim 1 further comprising applying a photoresist layer on top of the second metal layer, prior to aligning the ultraviolet laser beam and cutting the kerf, wherein cutting the kerf includes using the ultraviolet laser beam to cut through the photoresist using the reference feature.

5. The method of claim 4 further comprising stripping the photoresist layer subsequent to cleaning the debris off the walls of the kerf, wherein the photoresist layer protects a portion of the second metal layer from debris during the cutting of the kerf.

6. The method of claim 5 further comprising removing the portion of the second metal layer subsequent to stripping the photoresist layer, using an etchant, wherein the photoresist layer and the portion of the second metal layer protect a respective portion of the front surface of the semiconductor film from the debris during the cutting of the kerf.

7. The method of claim 1 wherein the semiconductor film is formed on a semiconductor wafer.

8. A method of kerf formation and treatment in semiconductor films, comprising:
    providing a semiconductor film having semiconductor devices thereupon and having a front surface;
    depositing a metal seed layer on top of the front surface of the film;
    defining a reference feature on the film;
    depositing a photoresist layer on top of the metal seed layer to define a non-plated region that includes the reference feature;
    depositing a metal plating on top of the metal seed layer in a plating region having an absence of the photoresist layer;
    directing an ultraviolet laser beam to cut through the photoresist layer, through the metal seed layer and through the semiconductor film;
    moving the film and the ultraviolet laser beam relative to each other to laser cut along the reference feature, thereby forming a kerf with edges and depositing debris on a portion of the photoresist layer and on the kerf edges;
    wet-cleaning the kerf to remove the debris, using an acid-based solvent;
    stripping the photoresist layer, thereby exposing a portion of the metal seed layer in the non-plated region; and
    etching the exposed portion of the metal seed layer, using an etchant that preferentially removes material therefrom, with the metal plating remaining in the plating region and a to-be-exposed portion of the front surface of the semiconductor film in the non-plated region becoming exposed;
    wherein the photoresist layer and the portion of the metal seed layer in the non-plated region protect the to-be-exposed portion of the front surface of the semiconductor film from debris during the laser cutting.

9. The method of claim 8 further comprising rinsing the semiconductor film with deionized water after wet-cleaning the semiconductor film, wherein the solvent comprises a mixture of hydrogen peroxide, sulfuric acid and water.

10. The method of claim 9 wherein the solvent further comprises phosphoric acid.

11. The method of claim 8 wherein the semiconductor devices are solar cells.

12. The method of claim 8 further defined by forming the semiconductor film on a semiconductor wafer.

13. The method of claim 8 further comprising:
    providing a first metal layer backing the film, wherein the laser cutting further cuts through the first metal layer;
    rinsing the film with deionized water after wet-cleaning the kerf;
    rinsing the film with deionized water after stripping the photoresist layer;
    drying the film after the rinsing with deionized water that follows the stripping the photoresist layer; and
    testing the semiconductor devices individually subsequent to the exposed portion of the metal seed layer being etched, with the laser cutting and separating respective first terminals of the semiconductor devices.

14. The method of claim 13 further comprising adhering the first metal layer to a flexible substrate, using an adhesive layer, wherein the laser cutting leaves the flexible substrate and the adhesive layer intact and the flexible substrate supports the first metal layer and the film during handling of the semiconductor film subsequent to the laser cutting.

* * * * *